(12) United States Patent
Lin et al.

(10) Patent No.: US 10,522,087 B2
(45) Date of Patent: Dec. 31, 2019

(54) DISPLAY HAVING GATE DRIVER BOOTSTRAPPING CIRCUITRY WITH ENHANCED-EFFICIENCY

(71) Applicant: Apple Inc., Cupertino, CA (US)

(72) Inventors: Chin-Wei Lin, San Jose, CA (US); Majid Gharghi, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/986,725

(22) Filed: May 22, 2018

(65) Prior Publication Data

US 2019/0088206 A1    Mar. 21, 2019

Related U.S. Application Data

(60) Provisional application No. 62/559,365, filed on Sep. 15, 2017.

(51) Int. Cl.
G09G 3/32     (2016.01)
G09G 3/3266   (2016.01)
H01L 27/32    (2006.01)

(52) U.S. Cl.
CPC ... G09G 3/3266 (2013.01); G09G 2300/0426 (2013.01); G09G 2320/0219 (2013.01); H01L 27/3265 (2013.01)

(58) Field of Classification Search
None
See application file for complete search history.

(56) References Cited

U.S. PATENT DOCUMENTS

| 5,384,486 A | * | 1/1995 | Konno | H01L 23/5221 |
| | | | | 257/275 |
| 8,040,163 B2 | | 10/2011 | Jinta | |
| 2011/0007049 A1 | | 1/2011 | Kikuchi et al. | |
| 2012/0162179 A1 | * | 6/2012 | Tanaka | G09G 3/3677 |
| | | | | 345/211 |
| 2017/0098413 A1 | * | 4/2017 | Lee | G11C 19/28 |
| 2017/0176794 A1 | | 6/2017 | Umezaki et al. | |
| 2017/0185194 A1 | | 6/2017 | Kim et al. | |

* cited by examiner

*Primary Examiner* — Joseph R Haley
(74) *Attorney, Agent, or Firm* — Treyz Law Group, P.C.; G. Victor Treyz; Tianyi He

(57) ABSTRACT

A display may have gate driver circuitry that include a series of linked gate driver circuits each of which has an output and has an input coupled to the output of a preceding one of the gate driver circuits. Bootstrapping circuitry may be provided in the gate driver circuitry. Each gate driver circuit may have a bootstrapping circuit that includes transistors and a bootstrapping capacitor. Bootstrapping efficiency may be enhanced by configuring the bootstrapping capacitor to reduce parasitic capacitances. A transistor in each bootstrapping circuit may have first and second source-drain terminals, and a gate terminal that lies between the first and second source-drain terminals and that runs parallel to the first and second source-drain terminals. The bootstrapping capacitor may have a first electrode formed from the gate terminal and a second electrode that overlaps the first electrode and that lies between the first and second source-drain terminals.

20 Claims, 6 Drawing Sheets

DISPLAY HAVING GATE DRIVER BOOTSTRAPPING CIRCUITRY WITH ENHANCED-EFFICIENCY

This application claims the benefit of provisional patent application No. 62/559,365, filed Sep. 15, 2017, which is hereby incorporated by reference herein in its entirety.

BACKGROUND

This relates generally to electronic devices, and, more particularly, to electronic devices with displays.

Electronic devices such as cellular telephones, computers, and other electronic devices often contain displays. A display includes an array of pixels for displaying images. Display driver circuitry such as data line driver circuitry may supply data signals to the pixels. Gate line driver circuitry in the display driver circuitry can be used to provide control signals to the pixels. Gate line driver circuitry may include bootstrapping circuits to enhance the magnitude of the control signals.

It can be challenging to achieve desired bootstrapping efficiency in a bootstrapping circuit. This can lead to the use of undesirably large areas for bootstrapping capacitors and other components in bootstrapping circuits. As a result, display borders may be larger than desired.

SUMMARY

A display may have pixels. Display driver circuitry supplies data to the pixels over data lines. Gate driver circuitry in the display driver circuitry supplies control signals to the pixels over gate lines. The gate driver circuitry may include a series of linked gate driver circuits each of which has an output and has an input coupled to the output of a preceding one of the gate driver circuits.

Bootstrapping circuitry may be provided in the gate driver circuitry to enhance the magnitude of output signals on the outputs. Each gate driver circuit may have a bootstrapping circuit that includes transistors and a bootstrapping capacitor. Bootstrapping efficiency may be enhanced by configuring the bootstrapping capacitor to reduce parasitic capacitances.

A transistor in each bootstrapping circuit may have first and second source-drain terminals, a gate terminal that lies between the first and second source-drain terminals and that runs parallel to the first and second source-drain terminals. The bootstrapping capacitor may have a first electrode formed from the gate terminal and a second electrode that overlaps the first electrode and that lies between the first and second source-drain terminals.

DETAILED DESCRIPTION

Figure 1:
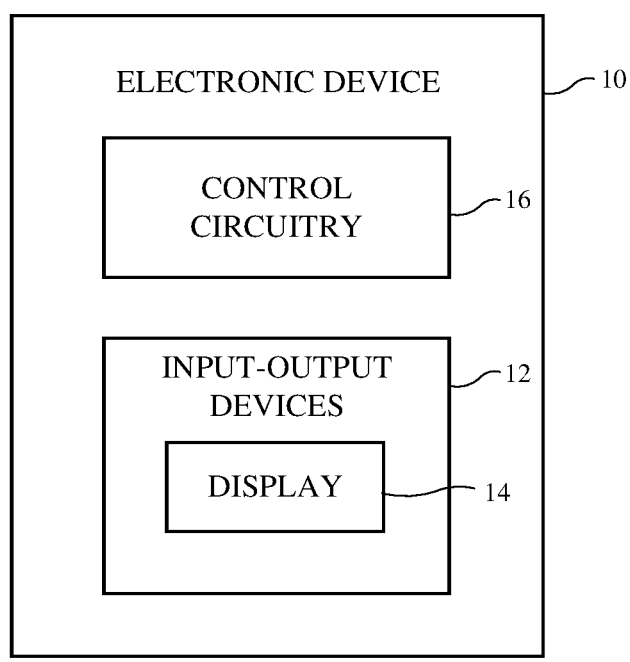
FIG. 1 is a schematic diagram of an illustrative electronic device having a display in accordance with an embodiment.

An illustrative electronic device of the type that may be provided with a display is shown in FIG. 1. Electronic device 10 of FIG. 1 may be a tablet computer, laptop computer, a desktop computer, a monitor that includes an embedded computer, a monitor that does not include an embedded computer, a display for use with a computer or other equipment that is external to the display, a cellular telephone, a media player, a wristwatch device or other wearable electronic equipment, or other suitable electronic device.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint) or may have other suitable shapes. Display 14 may be planar or may have a curved profile. Display 14 may be an organic light-emitting diode display or other suitable type of display.

Figure 2:
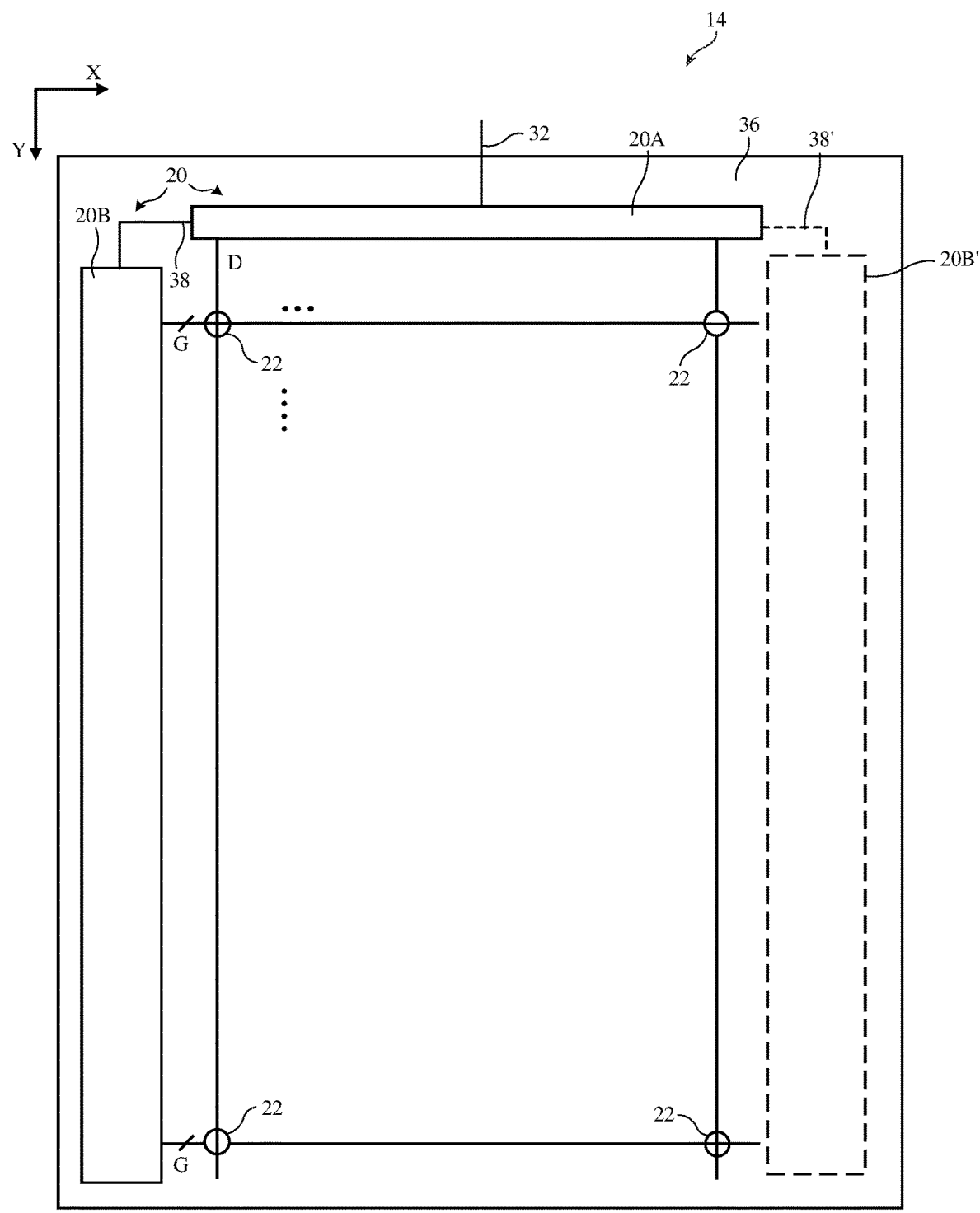
FIG. 2 is a top view of an illustrative display in an electronic device in accordance with an embodiment.

A top view of a portion of display 14 is shown in FIG. 2. As shown in FIG. 2, display 14 may have an array of pixels 22 formed from substrate structures such as substrate 36. Substrates such as substrate 36 may be formed from glass, metal, plastic, ceramic, or other substrate materials. Pixels 22 may receive data signals over signal paths such as data lines D and may receive one or more control signals over control signal paths such as gate lines G (sometimes referred to as control lines, scan lines, emission enable control lines, gate signal paths, etc.). There may be any suitable number of rows and columns of pixels 22 in display 14 (e.g., tens or more, hundreds or more, or thousands or more). Pixels 22 may have different colors (e.g., red, green, and blue) to provide display 14 with the ability to display color images. Pixels 22 may contain respective light-emitting diodes and pixel circuits that control the application of current to the light-emitting diodes. The pixel circuits in pixels 22 may contain transistors (e.g., thin-film transistors on substrate 36) having gates that are controlled by gate line signals on gate lines G.

Display driver circuitry 20 may be used to control the operation of pixels 22. Display driver circuitry 20 may be formed from integrated circuits, thin-film transistor circuits, or other suitable circuitry. Thin-film transistor circuitry for display driver circuitry 20 and pixels 22 may be formed from polysilicon thin-film transistors, semiconducting-oxide thin-film transistors such as indium gallium zinc oxide transistors, or thin-film transistors formed from other semiconductors.

Display driver circuitry 20 may include display driver circuits such as display driver circuit 20A and gate driver circuitry 20B. Display driver circuit 20A may be formed from one or more display driver integrated circuits and/or thin-film transistor circuitry (e.g., timing controller integrated circuits). Gate driver circuitry 20B may be formed from gate driver integrated circuits or may be thin-film "gate-on-array" circuitry. Configurations in which circuitry 20B is formed from thin-film transistor circuitry on substrate 36 are sometimes described herein as an example.

As shown in FIG. 2, display driver circuit 20A may contain communications circuitry for communicating with system control circuitry such as control circuitry 16 of FIG. 1 over path 32. Path 32 may be formed from traces on a flexible printed circuit or other conductive lines. During operation, the control circuitry (e.g., control circuitry 16 of FIG. 1) may supply circuit 20A with information on images to be displayed on display 14.

Figure 3:
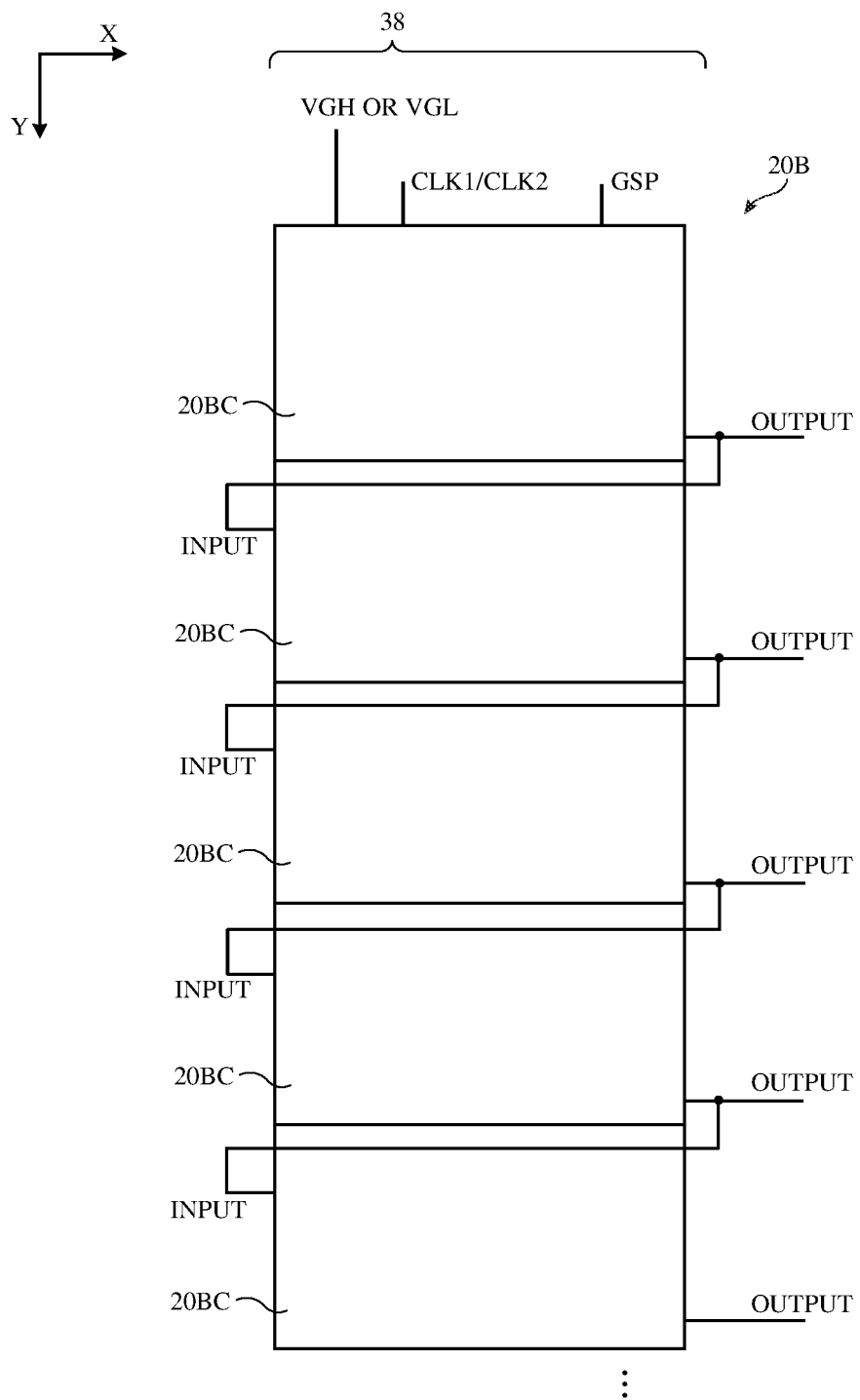
FIG. 3 is a circuit diagram of illustrative gate driver circuitry in a display in accordance with an embodiment.

To display images on display pixels 22, display driver circuitry 20A may supply image data to data lines D while issuing control signals to supporting display driver circuitry such as gate driver circuitry 20B over path 38. As shown in FIG. 3, gate driver circuitry 20B may contain a series of linked gate driver circuits 20BC (e.g., a series of register-based circuits that are linked together in a chain to form a shift register). Each circuit 20BC may have an output OUTPUT and may have an input INPUT that receives the output signal of a preceding one of circuits 20BC. Paths 38 may include lines for carrying power signals such as a gate high voltage signal Vgh and/or a gate low voltage signal Vgl (e.g., a voltage with a magnitude lower than Vgh). These power signals can be used by gate driver circuitry 20B to produce desired output signals OUTPUT (e.g., gate signals G). Path 38 may also include lines for carrying clock signals (CLK1 and/or CLK2) and, for use in initiating the shift register formed by the linked series of gate driver circuits 20BC, a gate start pulse signal GSP that is applied to the input of the first circuit 20BC in gate driver circuitry 20B.

Figure 4:
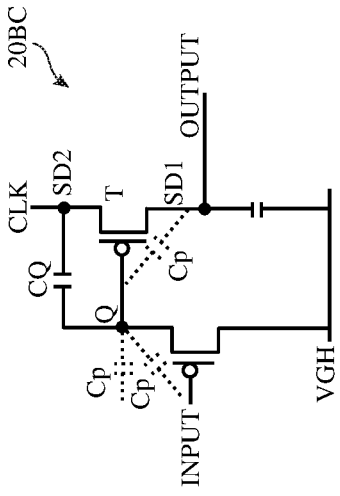
FIGS. 4, 5, 6, 7, 8, and 9 are illustrative bootstrapping circuits in accordance with embodiments.
Figure 5:
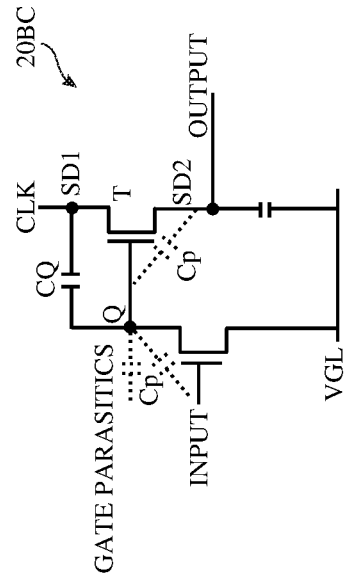
Figure 6:
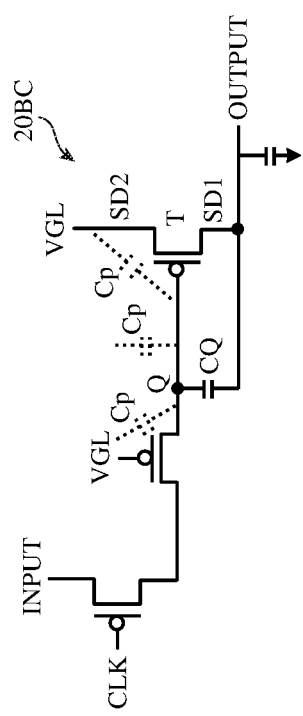
Figure 7:
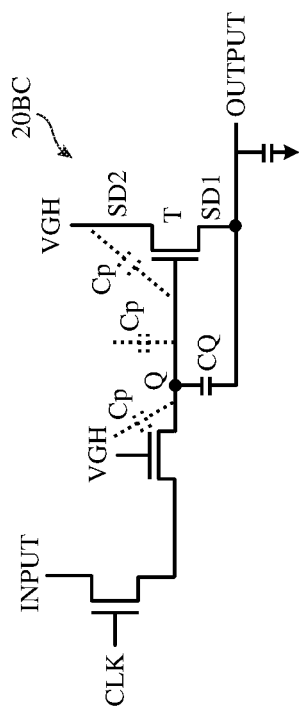
Figure 8:
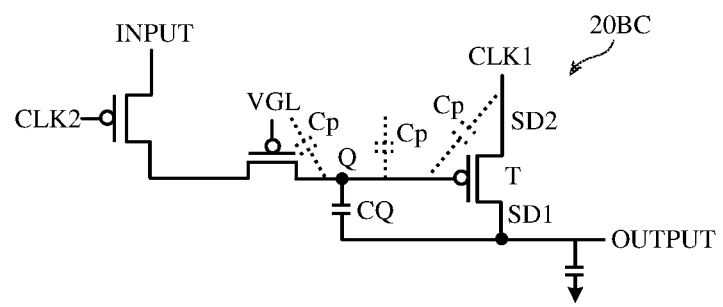
Figure 9:
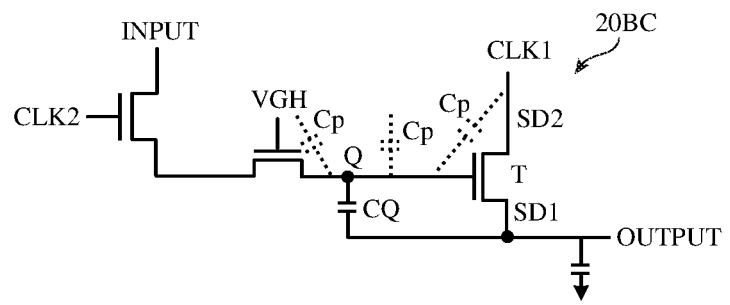

To produce output signals OUTPUT of desired magnitude, bootstrapping circuitry may be included in gate driver circuitry 20B. The bootstrapping circuitry may be used to enhance the magnitude of voltages on path 38 so that output signals of a desired magnitude may be provided at the outputs of circuits 20BC. Illustrative bootstrapping circuits 20BC are shown in FIGS. 4, 5, 6, 7, 8, and 9. FIGS. 4, 5, and 8 show p-channel metal-oxide-semiconductor (PMOS) circuits based on PMOS transistors. In these circuits, bootstrapping operations increase the magnitude of output signal OUTPUT by bootstrapping to lower (more negative) voltages. FIGS. 6, 7, and 9 show n-channel metal-oxide-semiconductor (NMOS) circuits based on NMOS transistors. In these circuits, bootstrapping operations increase the magnitude of output signal OUTPUT by bootstrapping to higher (more positive) voltages.

Bootstrapping capacitor CQ is used for bootstrapping the output voltage. Bootstrapping efficiency is enhanced in configurations that minimize parasitic gate capacitances Cp (e.g., bootstrapping efficiency is maximum when the ratio of CQ to Cp is maximized). When parasitic gate capacitances are low, the size of capacitor CQ can be reduced while still maintaining a desired bootstrapping efficiency. The circuitry in gate driver circuitry 20B can also be laid out more compactly and display border width, which is affected by the width of gate driver circuitry 20B, can be minimized to enhance the appearance of display 14.

Figure 10:
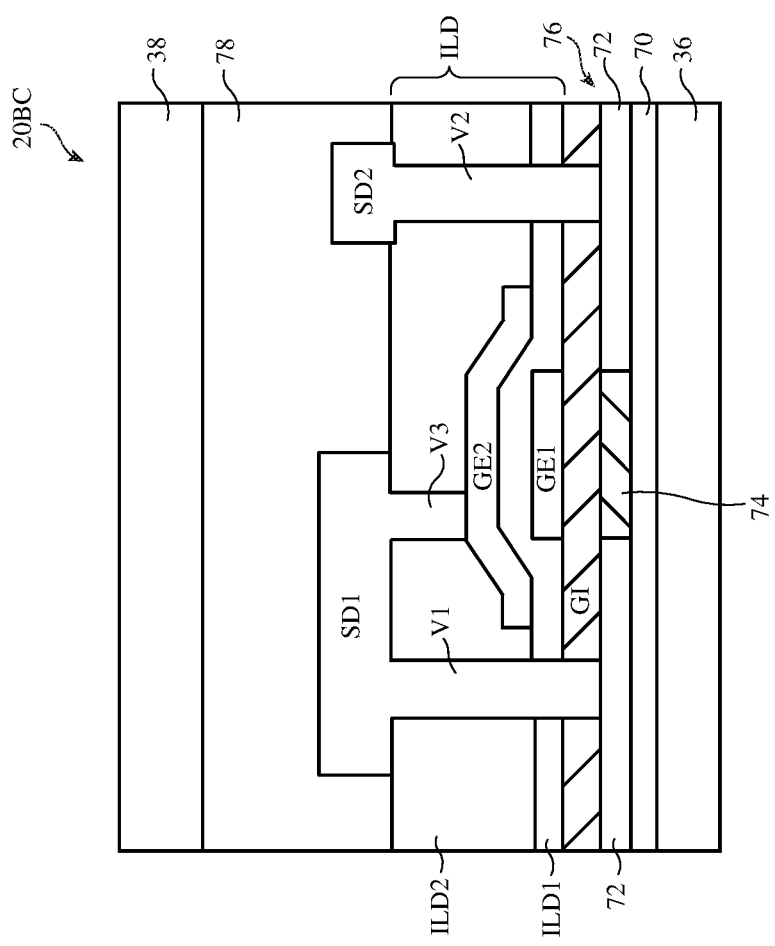
FIG. 10 is a cross-sectional side view of a portion of an illustrative bootstrapping circuit in accordance with an embodiment.

A cross-sectional side view of illustrative circuit structures that can be used in bootstrapping circuits 20BC to minimize parasitic capacitances Cp, is shown in FIG. 10. As shown in FIG. 10, circuit 20BC may include thin-film layers formed on substrate 36. Buffer layers and other layers (e.g., layer 70) may be formed on substrate 36. Semiconductor layer 76 may be formed on layer 70. Semiconductor layer 76 may be formed from silicon (e.g., polysilicon), semiconducting oxides such as InGaZnO, or other semiconductors. Semiconductor layer 76 may include heavily doped contact regions 72 and lightly doped active region 74.

Metal traces may form source-drain terminals for transistor T of FIGS. 4, 5, 6, 7, 8, and 9. These terminals may include a first terminal SD1 and a second terminal SD2. As shown in FIG. 10, metal traces in circuit 20BC may pass through dielectric layers such as dielectric layer ILD. For example, vias V1 and V2 may pass through layer ILD to form connections between terminals SD1 and SD2 and respective heavily doped regions 72. Dielectric layer 78 (e.g., a planarization layer or additional interlayer dielectric layer) may overlap dielectric layer ILD. Metal lines 38 may be formed from traces on layer 78.

Layers such as layer GI, ILD, and 78 may be formed from inorganic dielectrics (e.g., silicon oxide, silicon nitride, etc.) and/or from organic dielectrics (polymer). For example, GI may be formed from silicon oxide, ILD may be formed from silicon oxide and/or silicon nitride, and layer 78 may be formed from polymer or may be formed from silicon oxide and/or silicon nitride (as examples).

Interlayer dielectric layer ILD may include first interlayer dielectric layer ILD1 and second interlayer dielectric layer ILD2. Gate insulator layer GI may be formed on layer 76. Gate metal layer GE1 may be formed from a layer of metal that overlaps gate insulator layer GI in alignment with active area 74. Gate metal layer GE1 may form the gate terminal of transistor T and a first of two electrodes for capacitor CQ. Dielectric layer ILD1 may overlap gate insulator layer (gate dielectric layer) GI and gate metal layer GE1. Gate metal layer GE2 may be formed on dielectric layer ILD2 overlapping gate metal layer GE1. Gate metal layer GE2 may form a second of the two electrodes for capacitor CQ and may be connected to node Q. Via V3, which passes through dielectric layer ILD2, may be used to couple gate metal layer GE2 to terminal SD1.

In this type of configuration, the metal layer that forms gate terminal GE1 (and that forms the first electrode of capacitor CQ) may sometimes be referred to as a first metal layer, the metal layer that forms second capacitor electrode GE2 may sometimes be referred to as a second metal layer, the metal layer that forms source-drain terminals SD1 and SD2 may sometimes be referred to as a third metal layer, and the metal layer that forms traces 38 may sometimes be referred to as a fourth metal layer. Other metal layers may be incorporated into circuits 20B, if desired.

Figure 11:
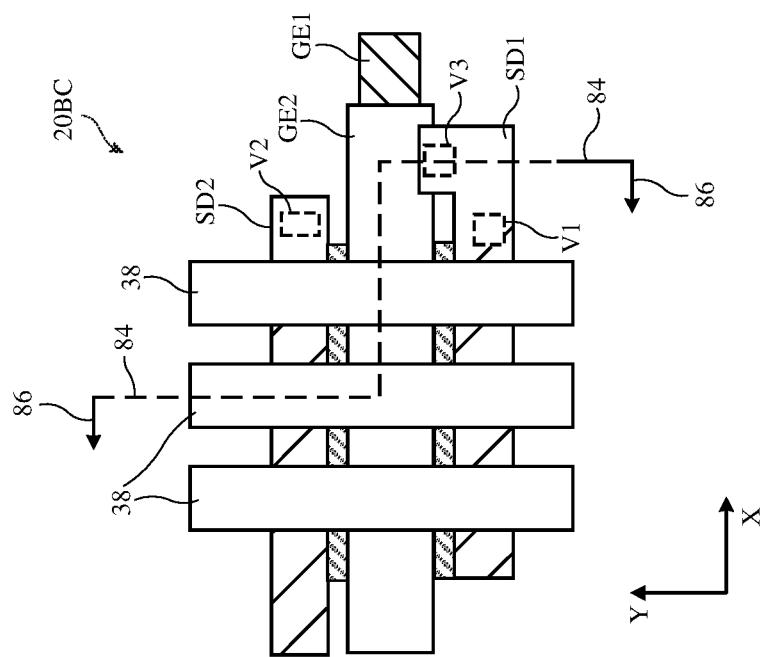
FIG. 11 is a top view of the illustrative bootstrapping circuit structures of FIG. 10 in accordance with an embodiment.

FIG. 11 is a top view of bootstrapping circuit 20BC of FIG. 10. FIG. 10 is a cross-sectional side view of bootstrapping circuit 20BC of FIG. 11 taken along line 84 and viewed in direction 86. As shown in FIG. 11, source-drain terminals SD1 and SD2 are formed from elongated strips of metal and extend parallel to the X axis. Gate terminal GE1 is formed from an elongated strip of metal that lies between terminals SD1 and SD2. Gate terminal GE1 runs parallel to SD1 and SD2 along the X dimension. Lines 38 run orthogonally across source-drain terminals SD1 and SD2 and gate metal layers GE1 and GE2.

As shown in FIGS. 10 and 11, the width of gate metal layer GE2 in dimension Y between source-drain terminals SD1 and SD2 is greater than the width of gate metal layer GE1. As a result, gate metal layer GE2 (the second electrode for capacitor CQ) overlaps and shields gate metal layer GE1 (the first electrode for capacitor CQ) from nearby metal structures such as the metal traces for terminals SD1 and SD2 and the metal traces of lines 38. Gate metal layer GE2 may also help shield gate metal layer GE1 from conductive heavily doped regions 72 in layer 76. Because gate metal layer GE2 covers and shields gate metal layer GE1 from these nearby conductive structures, parasitic capacitances Cp between gate meatal layer GE1 and these nearby conductive structures may be reduced or eliminated. This enhances bootstrapping efficiency for bootstrapping circuit 20BC.

The foregoing is merely illustrative and various modifications can be made to the described embodiments. The foregoing embodiments may be implemented individually or in any combination.

What is claimed is:

1. A display gate driver bootstrapping circuit, comprising: a capacitor having a first electrode formed from a first layer of metal and having a second electrode formed from a second layer of metal; a first layer of dielectric between the first and second layers of metal; a transistor having a gate terminal formed from the first layer of metal forming the first electrode and having first and second source-drain terminals formed from a third layer of metal, wherein the second layer of metal is interposed between the first layer of metal and the third layer of metal; and a second layer of dielectric between the second and third layers of metal, wherein the second layer of metal forming the second electrode overlaps the first layer of metal forming the first electrode between the first and second source-drain terminals.

2. The display gate driver bootstrapping circuit defined in claim 1, wherein the first source-drain terminal extends along a dimension and wherein the second source-drain terminal extends along the dimension parallel to the first source-drain terminal.

3. The display gate driver bootstrapping circuit defined in claim 2, wherein the gate terminal formed from the first layer of metal extends along the dimension between the first and second source-drain terminals and has a first width orthogonal to the dimension, wherein the second electrode has a second width orthogonal to the dimension between the first and second source-drain terminals, and wherein the second width is greater than the first width.

4. The display gate driver bootstrapping circuit defined in claim 3 further comprising:
a semiconductor layer; and
a gate insulator layer overlapping the semiconductor layer and interposed between an active region of the semiconductor layer and the gate terminal.

5. The display gate driver bootstrapping circuit defined in claim 4 further comprising:
first and second contact regions in the semiconductor layer on opposing sides of the gate terminal; and
a first via that couples the first source-drain terminal to the first contact region and a second via that couples the second source-drain terminal to the second contact region.

6. The display gate driver bootstrapping circuit defined in claim 5 further comprising:
a via that passes through the second dielectric layer and that couples the first source-drain terminal to the second electrode.

7. The display gate driver bootstrapping circuit defined in claim 6 further comprising:
a third layer of dielectric that overlaps the third layer of metal; and
metal lines on the third layer of dielectric that run orthogonally to the dimension.

8. The display gate driver bootstrapping circuit defined in claim 7, wherein the metal lines include a power supply line and a clock line.

9. Gate driver circuitry, comprising: a series of gate driver circuits each of which has an output and has an input coupled to the output of a preceding one of the gate driver circuits; and bootstrapping circuits each of which forms part of a respective one of the gate driver circuits, wherein each of the bootstrapping circuits comprises: a capacitor having a first electrode formed from a first layer of metal and having a second electrode formed from a second layer of metal; a first layer of dielectric between the first and second layers of metal; a transistor having a gate terminal formed from the first electrode and having first and second source-drain terminals formed from a third layer of metal; and a second layer of dielectric between the second and third layers of metal, wherein the second electrode overlaps the first electrode and is between the first and second source-drain terminals, and wherein the second electrode is configured to shield the first electrode from the first and second source-drain terminals.

10. The gate driver circuitry defined in claim 9, wherein the first and second source-drain terminals of each bootstrapping circuit are formed respectively from first and second strips of the third layer of metal that extend along a direction and wherein the first electrode is formed from a strip of the first layer of metal that lies between the first and second strips of the third layer of metal and that extends along the direction.

11. The gate driver circuitry defined in claim 10, wherein each of the bootstrapping circuits comprises:
a semiconductor layer; and
a gate insulator layer overlapping the semiconductor layer and interposed between an active region of the semiconductor layer and the gate terminal.

12. The gate driver circuitry defined in claim 11, wherein each of the bootstrapping circuits comprises:
first and second contact regions in the semiconductor layer on opposing sides of the gate terminal; and a first via that couples the first source-drain terminal to the first contact region and a second via that couples the second source-drain terminal to the second contact region.

13. The gate driver circuitry defined in claim 12, wherein each of the bootstrapping circuits comprises:
   at least one via that passes through the second dielectric layer and that couples the first source-drain terminal to the second electrode.

14. The gate driver circuitry defined in claim 13, wherein each of the bootstrapping circuits comprises:
   a third layer of dielectric that overlaps the third layer of metal; and
   metal lines on the third layer of dielectric that are orthogonal to the direction.

15. The gate driver circuitry defined in claim 14, wherein the metal lines cross over the first source-drain terminal, the gate terminal, and the second source-drain terminal of each of the bootstrapping circuits.

16. A display, comprising:
   pixels;
   data lines configured to supply data to the pixels;
   gate lines configured to supply control signals to the pixels; and
   gate driver circuitry coupled to the gate lines, wherein the gate driver circuitry includes a chain of gate driver circuits, each gate driver circuit having:
      a capacitor having a first electrode formed from a first layer of metal and having a second electrode formed from a second layer of metal;
      a first layer of dielectric between the first and second layers of metal;
      a transistor having a gate terminal formed from the first electrode and having first and second source-drain terminals formed from a third layer of metal, wherein the second electrode of the capacitor is interposed between the first electrode of the capacitor and the first and second source-drain terminals; and
      a second layer of dielectric between the second and third layers of metal, wherein the second electrode overlaps the first electrode and is between the first and second source-drain terminals.

17. The display defined in claim 16, wherein the first source-drain terminal extends along a dimension, wherein the second source-drain terminal extends along the dimension parallel to the first source-drain terminal, and wherein the gate terminal formed from a strip of the first layer of metal that extends along the dimension between the first and second source-train terminals.

18. The display defined in claim 17 wherein each gate driver circuit further comprises:
   first and second contact regions in a semiconductor layer on opposing sides of the gate terminal; and
   vias that couple the first source-drain terminal to the first contact region and that couple the second source-drain terminal to the second contact region.

19. The display defined in claim 18 wherein each gate driver circuit further comprises:
   a gate insulator layer overlapping the semiconductor layer and interposed between an active region of the semiconductor layer and the gate terminal;
   a third layer of dielectric that overlaps the third layer of metal; and
   metal lines on the third layer of dielectric that are orthogonal to the dimension.

20. The display defined in claim 19 wherein the metal lines include a clock line and a power supply line.

* * * * *